(12) United States Patent
Wang et al.

(10) Patent No.: US 8,022,452 B2
(45) Date of Patent: Sep. 20, 2011

(54) ELIMINATION OF GLOWING ARTIFACT IN DIGITAL IMAGES CAPTURED BY AN IMAGE SENSOR

(75) Inventors: Shen Wang, Webster, NY (US); Robert P. Fabinski, Rochester, NY (US); Robert Kaser, Spencerport, NY (US)

(73) Assignee: Omnivision Technologies, Inc., Santa Clara, CA (US)

( * ) Notice: Subject to any disclaimer, the term of this patent is extended or adjusted under 35 U.S.C. 154(b) by 221 days.

(21) Appl. No.: 12/333,532

(22) Filed: Dec. 12, 2008

(65) Prior Publication Data

US 2010/0148231 A1    Jun. 17, 2010

(51) Int. Cl.
*H01L 31/0232* (2006.01)

(52) U.S. Cl. ........ 257/294; 257/223; 257/435; 257/445; 257/446; 257/E31.122

(58) Field of Classification Search .................. 257/223, 257/229, 230, 435, 452, 466, E27.139, E27.162, 257/E31.122, 290–294, 432, 444–446, 508, 257/E27.145, E31.123; 349/59, 110, 111
See application file for complete search history.

(56) References Cited

U.S. PATENT DOCUMENTS

| | | | |
|---|---|---|---|
| 6,188,093 B1 * | 2/2001 | Isogai et al. | 257/230 |
| 6,449,022 B1 * | 9/2002 | Fukata et al. | 349/44 |
| 6,734,463 B2 * | 5/2004 | Ishikawa | 257/79 |
| 6,768,535 B2 * | 7/2004 | Yasukawa et al. | 349/187 |
| 7,285,808 B2 * | 10/2007 | Kasuga | 257/223 |
| 7,518,172 B2 * | 4/2009 | Moon et al. | 257/292 |
| 2005/0280007 A1 * | 12/2005 | Hsu et al. | 257/79 |
| 2006/0038203 A1 | 2/2006 | Wang et al. | |

FOREIGN PATENT DOCUMENTS

EP    0 487 209 A1    5/1992
* cited by examiner

*Primary Examiner* — Jerome Jackson, Jr.
*Assistant Examiner* — Yu Chen
(74) *Attorney, Agent, or Firm* — Blakely Sokoloff Taylor & Zafman LLP

(57) ABSTRACT

A source/drain region of a transistor or amplifier is formed in a substrate layer and is connected to a voltage source. A glow blocking structure is formed at least partially around the source/drain region and is disposed between the source/drain region and an imaging array of an image sensor. A trench is formed in the substrate layer adjacent to and at least partially around the source/drain region. The glow blocking structure includes an opaque material formed in the trench and one or more layers of light absorbing material overlying the source/drain region and the opaque material.

5 Claims, 8 Drawing Sheets

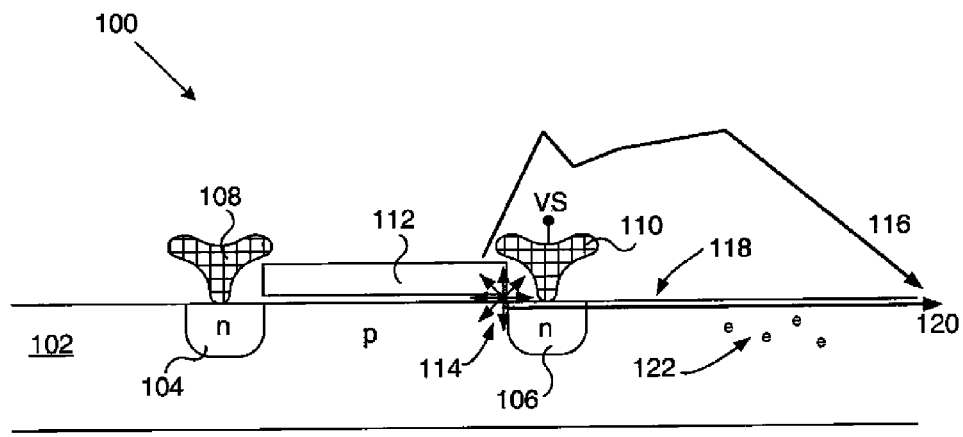
FIG. 1 - Prior Art
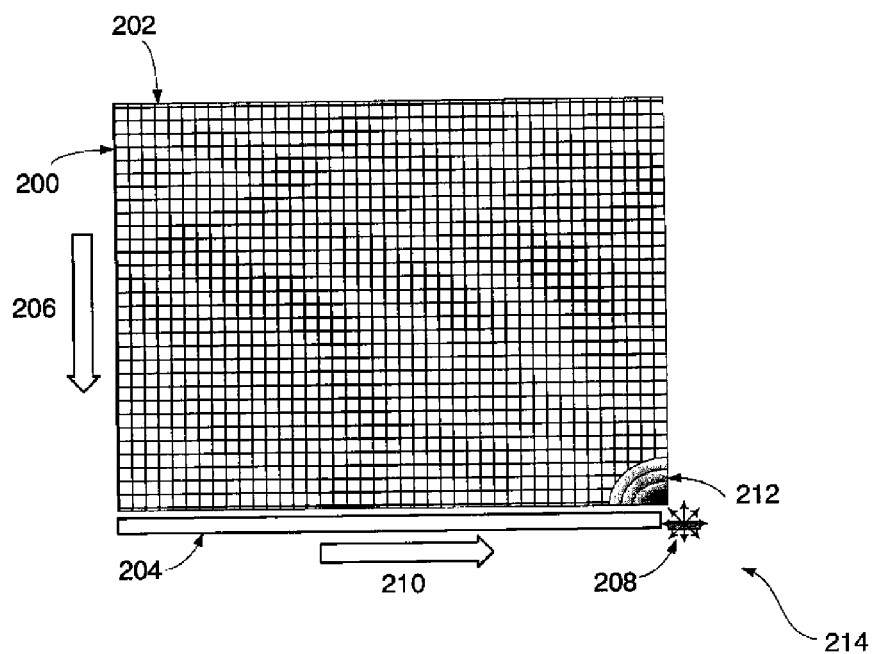
FIG. 2 - Prior Art

ELIMINATION OF GLOWING ARTIFACT IN DIGITAL IMAGES CAPTURED BY AN IMAGE SENSOR

TECHNICAL FIELD

The present invention relates generally to image sensors for use in digital cameras and other types of image capture devices, and more particularly to any type of image sensor that experiences glow from a transistor or amplifier. Still more particularly, the present invention relates to an image sensor having a glow blocking structure disposed between a source/drain region of a transistor and an imaging array.

BACKGROUND

A traditional camera system includes a camera body, lens, electronics to control the functionality of the camera, and the image-capturing media, film. In contrast, instead of using film, a digital camera usually employs an image sensor made on semiconductor substrate. Typically the image sensor is either a Charge Coupled Device (CCD) or a Complementary Metal Oxide Semiconductor (CMOS) image sensor. For illustrative purposes only, the image sensor discussed herein is an area CCD image sensor.

An area CCD image sensor consists of a number of photosensitive elements called pixels that are arranged in rows and columns to form a two-dimensional imaging array. The pixels capture light from a scene of interest and convert the incident light into charge carriers. The charge carriers are then transferred out of the imaging array using vertical CCD shift registers and one or more horizontal CCD shift registers. Each CCD shift register has at least one output structure which consists of one or more transistors, namely amplifiers, to convert the charge carriers from the pixels to voltage signals. The voltage signals are then converted to digital signals and the digital signals processed to render a digital image.

An amplifier typically consists of one or more transistors, each of which has a drain, a source and a gate. Referring to FIG. 1, there is shown a cross-section of a transistor 100 built on a semiconductor layer 102. It is noted that other types of transistors are applicable to the present invention, in which case the doping will vary according, as those skilled in the art will readily recognize. Source/drain regions 104, 106 of transistor 100 consist of n-type doping regions that are connected to contacts 108, 110.

Source/drain 106 is usually connected to a high voltage source (VS) through contact 110. The voltage applied to source/drain 106 can create a strong electric field between gate 112 and source/drain 106 that generates a near-infra-read (NIR) light. The NIR light is mainly generated along the gate-source/drain side 114 of transistor 100 and propagates in every direction as indicated by the arrows. There are two light propagation paths that can potentially impact the imaging array.

One light propagation path 116 is the path through which light passes out of transistor 100 and then bounces back into a pixel within the imaging array. Another path 120 has the light passing through and underneath surface 118 and within the semiconductor layer 102, where it propagates into the imaging array. Path 120 has another potential impact. The charge carriers 122, such as electrons (e) or holes (p) that are generated by the light as it propagates along path 120, can diffuse into the imaging array.

When the light propagating along paths 116 and 120 enters the imaging array of the image sensor, it causes the affected pixels to generate additional charge carriers. These additional charges will be superimposed on the existing charge carriers related to the captured image, thereby creating a glowing phenomenon or artifact in the captured image. The glowing artifact is usually seen in one of the corners of the imaging area that is near the location of the amplifier.

FIG. 2 is a simplified diagram of a CCD image sensor that has an amplifier at the lower-right corner in an embodiment in accordance with the prior art. When a captured image is read out of imaging array 200, charge carriers are simultaneously transferred through each vertical CCD shift register 202 on a row-by-row basis to horizontal shift register 204. The vertical transfer direction is indicated by arrow 206.

After each row is transferred to horizontal shift register 204, the charge carriers are serially transferred through horizontal shift register 204 to output amplifier 208. The horizontal transfer direction is indicated by arrow 210. The light emitting from amplifier 208 enters the pixels positioned at the lower-right corner of imaging array 200 to create an amplifier glow artifact in region 212 of imaging array 200.

Since amplifier 208 only glows when the voltage is applied to its source/drain region (e.g., region 106 in FIG. 1), one prior art solution to reduce amplifier glow is to minimize the amount of time output amplifier 208 is operational. Thus, during the image exposure period for imaging array 200, the voltage source is set to zero in order to turn off amplifier 208. This method removes the glow during the image exposure period, but amplifier 208 must be turned on during image readout. And during image readout, amplifier glow occurs and affects the images captured by image sensor 214. Therefore, the impact from amplifier glow cannot be completely removed by this prior art method.

U.S. Pat. No. 7,402,882 discloses another technique for reducing amplifier glow. Multiple opaque layers are disposed around an amplifier to form an encapsulation for the amplifier. The encapsulation prevents the NIR light, and the charges generated by the NIR light, from affecting adjacent pixels. One possible limitation to this technique is the number of opaque layers used to form the encapsulation. The multiple layers, and in particular the layer disposed over the amplifier, adds complexity to the fabrication process for the image sensor. The additional complexity increases the cost of fabricating an image sensor.

SUMMARY

A source/drain region of a transistor or amplifier is formed in a substrate layer and is connected to a voltage source. A glow blocking structure is formed at least partially around the source/drain region that is connected to the voltage source. The glow blocking structure is disposed between the source/drain region and an imaging array of an image sensor. The glow blocking structure includes a trench that is formed in the substrate layer adjacent to and at least partially around the source/drain region. The glow blocking structure also includes an opaque material formed in the trench and one or more layers of light absorbing material overlying the source/drain region and the opaque material.

The opaque structure is implemented as a metal structure and the one or more layers of light absorbing material include a first color filter and a different second color filter in an embodiment in accordance with the invention. In another embodiment in accordance with the invention, the one or more layers of light absorbing material is implemented as a single layer of a black filter that does not transmit any visible light.

ADVANTAGEOUS EFFECT OF THE INVENTION

The present invention has the advantage of preventing amplifier glow from impacting an imaging array of an image sensor without requiring additional metal or other blocking materials. Additionally the fabrication steps used to construct a glow blocking structure can be incorporated into the fabrication steps of the image sensor without the need for additional fabrication steps, such as, for example, an additional mask or deposition step.

BRIEF DESCRIPTION OF THE DRAWINGS

FIG. 1 is a cross section view of a transistor in an embodiment in accordance with the prior art;

FIG. 2 is a top view of a CCD image sensor in an embodiment in accordance with the prior art;

DETAILED DESCRIPTION

Figure 3:
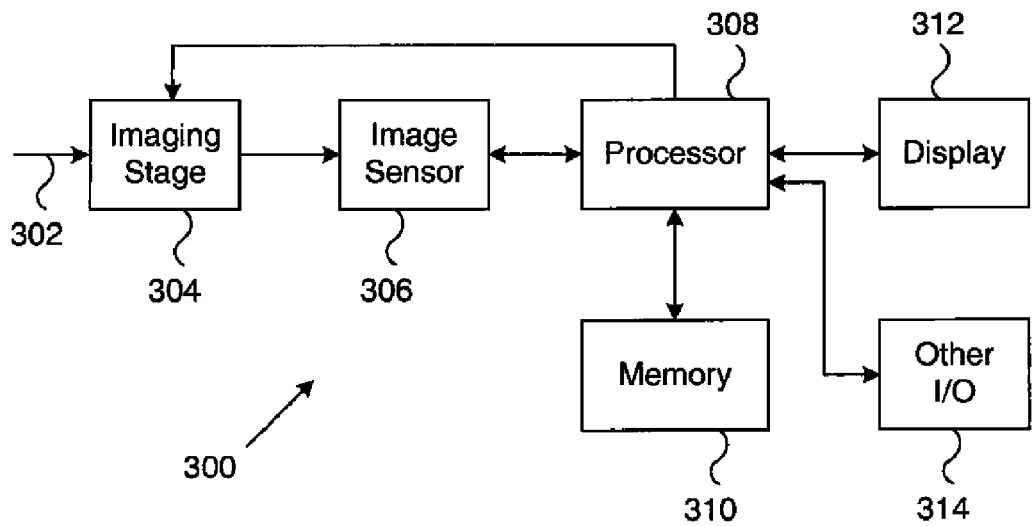
FIG. 3 is a simplified block diagram of an image capture device in an embodiment in accordance with the invention.

Throughout the specification and claims the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

Additionally, the terms "wafer" and "substrate layer" are to be understood as a semiconductor-based material including, but not limited to, silicon, silicon-on-insulator (SOI) technology, doped and undoped semiconductors, epitaxial layers formed on a semiconductor substrate, and other semiconductor structures.

Referring to the drawings, like numbers indicate like parts throughout the views.

FIG. 3 is shown a simplified block diagram of an image capture device in an embodiment in accordance with the invention. Image capture device 300 is implemented as a digital camera in FIG. 3. Those skilled in the art will recognize that a digital camera is only one example of an image capture device that can utilize an image sensor incorporating the present invention. Other types of image capture devices, such as, for example, cell phone cameras, scanners, and digital video camcorders, can be used with the present invention.

In digital camera 300, light 302 from a subject scene is input to an imaging stage 304. Imaging stage 304 can include conventional elements such as a lens, a neutral density filter, an iris and a shutter. Light 302 is focused by imaging stage 304 to form an image on image sensor 306. Image sensor 306 captures one or more images by converting the incident light into electrical signals. Digital camera 300 further includes processor 308, memory 310, display 312, and one or more additional input/output (I/O) elements 314. Although shown as separate elements in the embodiment of FIG. 3, imaging stage 304 may be integrated with image sensor 306, and possibly one or more additional elements of digital camera 300, to form a camera module. For example, a processor or a memory may be integrated with image sensor 306 in a camera module in embodiments in accordance with the invention.

Processor 308 may be implemented, for example, as a microprocessor, a central processing unit (CPU), an application-specific integrated circuit (ASIC), a digital signal processor (DSP), or other processing device, or combinations of multiple such devices. Various elements of imaging stage 304 and image sensor 306 may be controlled by timing signals or other signals supplied from processor 308.

Memory 310 may be configured as any type of memory, such as, for example, random access memory (RAM), read-only memory (ROM), Flash memory, disk-based memory, removable memory, or other types of storage elements, in any combination. A given image captured by image sensor 306 may be stored by processor 308 in memory 310 and presented on display 312. Display 312 is typically an active matrix color liquid crystal display (LCD), although other types of displays may be used. The additional I/O elements 314 may include, for example, various on-screen controls, buttons or other user interfaces, network interfaces, or memory card interfaces.

It is to be appreciated that the digital camera shown in FIG. 3 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Figure 4:
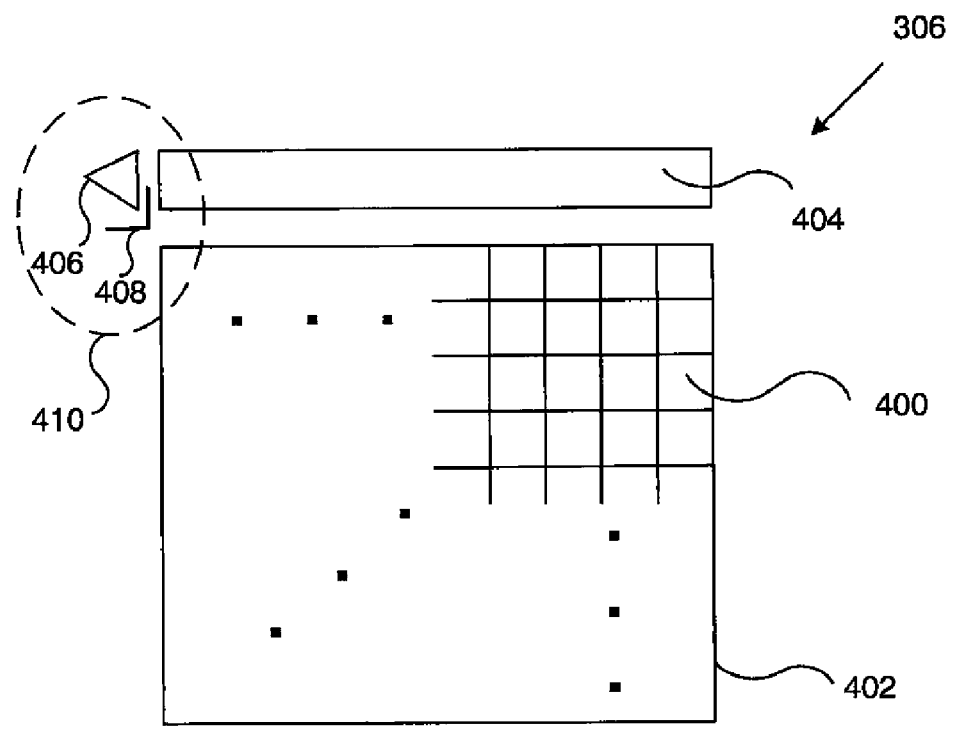
FIG. 4 is a simplified top view of image sensor 306 shown in FIG. 3 in an embodiment in accordance with the invention.

Referring now to FIG. 4, there is shown a simplified block diagram of image sensor 306 shown in FIG. 3 in an embodiment in accordance with the invention. Image sensor 306 is implemented as a Charge Coupled Device (CCD) image sensor in FIG. 4. Other embodiments in accordance with the invention are not limited to this type of image sensor. By way of example only, image sensor 306 may be implemented as a Complementary Metal Oxide Semiconductor (CMOS) image sensor in another embodiment in accordance with the invention.

Image sensor 306 includes a number of pixels 400 typically arranged in rows and columns to form an imaging array 402. Each pixel 400 is configured as a shift element with each column of pixels forming a vertical shift register. After an image is captured by pixels 400, the accumulated charges are read out of imaging array 402. During image readout, the vertical shift registers shift each row of accumulated charges or signals out to horizontal shift register 404. Horizontal shift register 404 then sequentially shifts the charges to output amplifier 406. Glow blocking structure 408 is formed between output amplifier 406 and imaging array 402.

Figure 5:
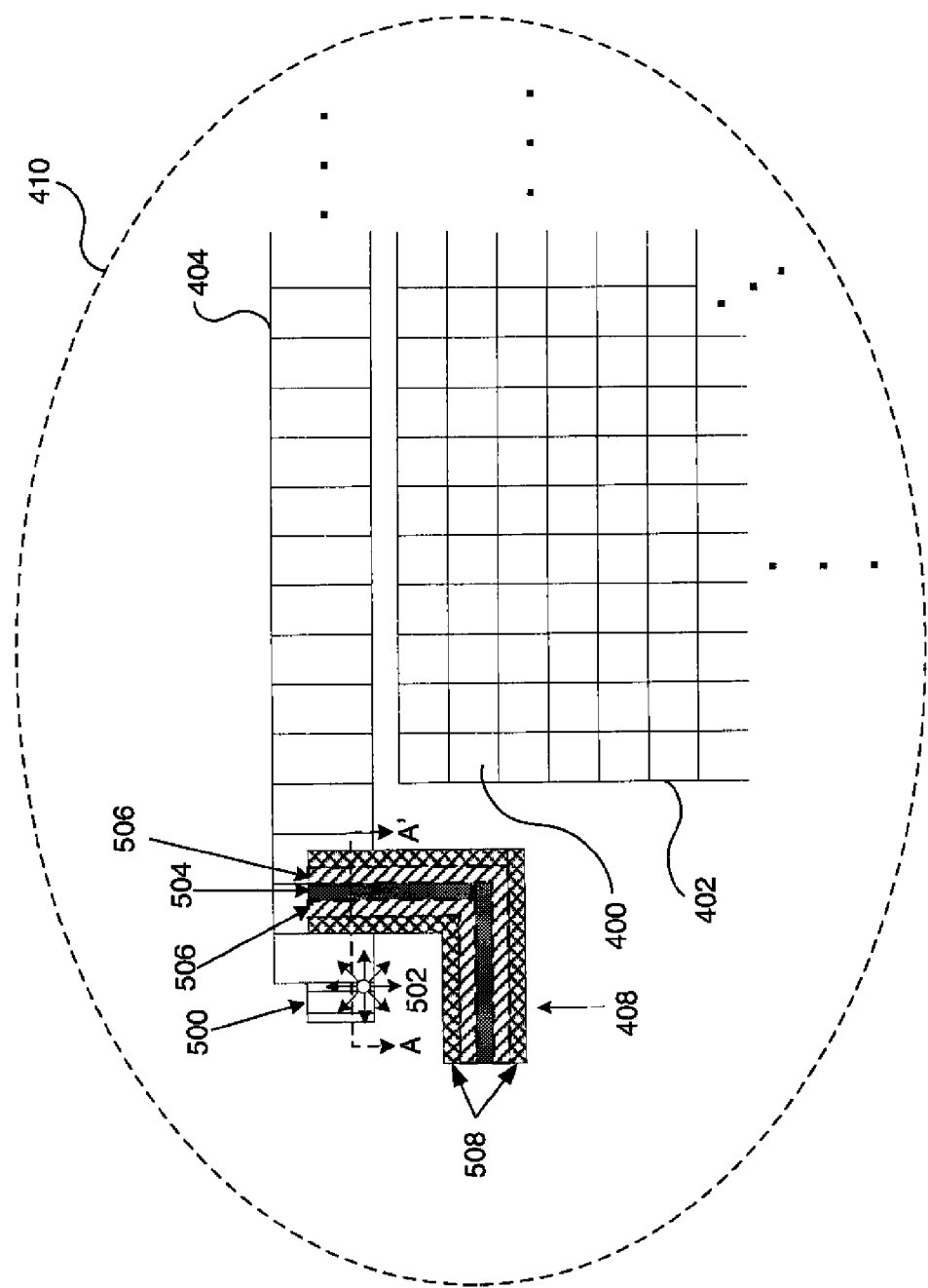
FIG. 5 is an expanded view of area 410 shown in FIG. 4 in an embodiment in accordance with the invention.

FIG. 5 is an expanded view of area 410 shown in FIG. 4 in an embodiment in accordance with the invention. Output amplifier 406 includes transistor 500. Adjacent to transistor 500 is glow blocking structure 408. Glow blocking structure 408 prevents the glow light 502, and the charge carriers generated by glow light 502, from propagating into or impacting the pixels 400 in imaging array 402.

In the embodiment shown in FIG. 5, glow blocking structure 408 in constructed in an "L" shape that partially surrounds transistor 500 in output amplifier 406. In other embodiments in accordance with the invention, glow blocking structure 408 can be constructed differently. By way of example only, glow blocking structure 408 can completely surround amplifier 406 or be constructed as a single wall disposed at an angle between amplifier 406 and imaging array 402.

Moreover, glow blocking structure 408 can be fabricated at different locations within an image sensor in other embodiments in accordance with the invention. The position of an amplifier or transistor that generates glow light 502 determines where glow light 502 will occur. For example, output amplifier 406 can be positioned in the middle of horizontal shift register 404, thereby causing glow blocking structure 408 to be constructed at a different location with respect to horizontal shift register 404.

Glow blocking structure 408 includes opaque structure 504, first filter layer 506, and second filter layer 508 in the embodiment of FIG. 5. Opaque structure 504 is formed with metal in an embodiment in accordance with the invention. Tungsten and aluminum are examples of metals that can be used to form opaque structure 504. Other embodiments in accordance with the invention may use a different opaque material to form opaque structure. By way of example only, any opaque material that is deposited and patterned in the imaging array can be used to simultaneously form opaque structure 504, thereby eliminating the need for an additional masking layer.

Figure 7:
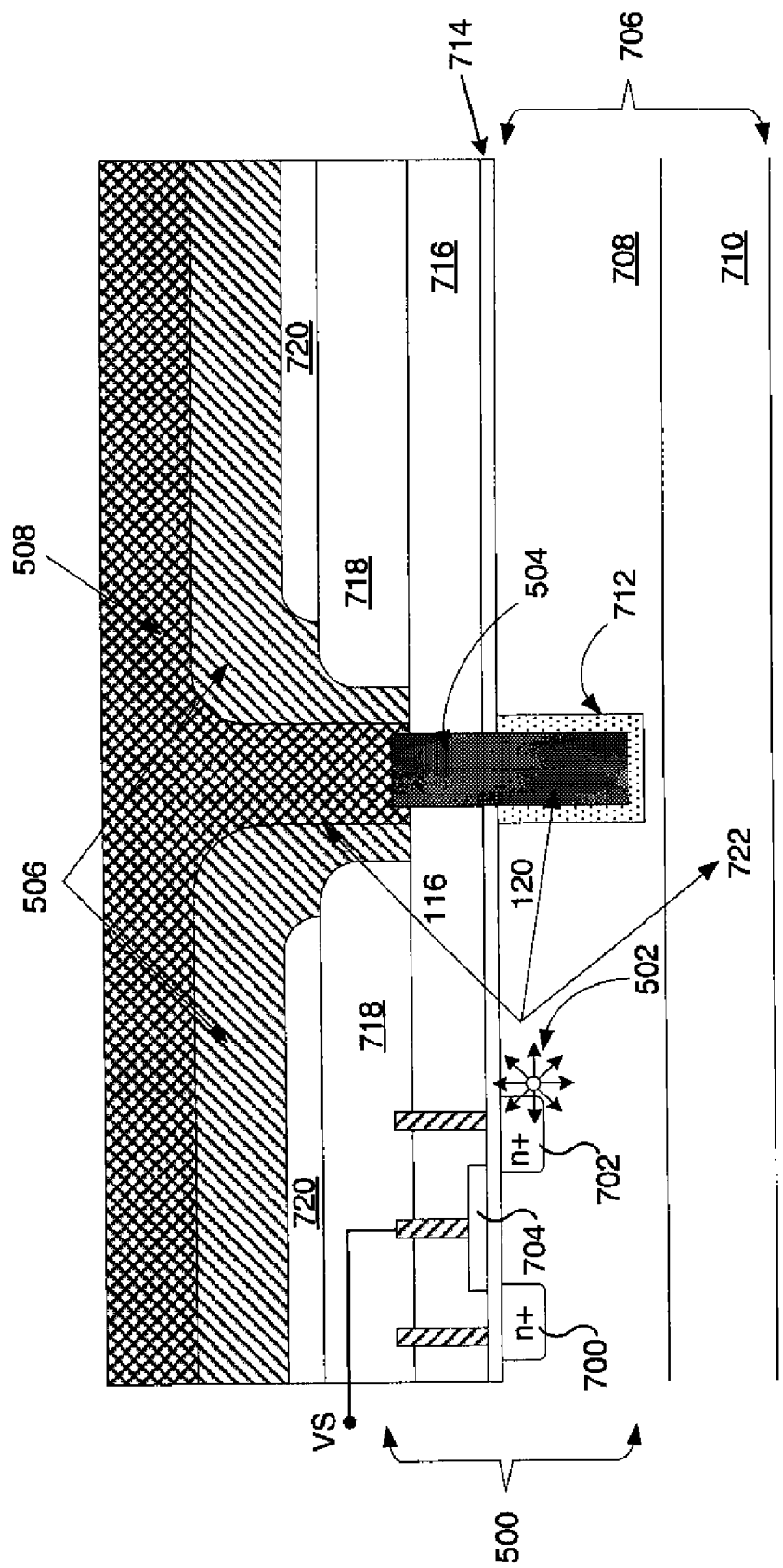
FIG. 7 is a cross section view along line A-A' shown in FIG. 5 in an embodiment in accordance with the invention.

Opaque structure 504 and first filter layer 506 are surrounded by dashed lines in FIG. 5 because opaque structure 504 and first filter layer 506 are not visible in a top view. As shown in FIG. 7, second filter layer 508 overlies and covers opaque structure 504 and first filter layer 506.

First filter layer 506 and second filter layer 508, when combined, block light propagating at all visible wavelengths. In the embodiment of FIG. 5, first filter layer 506 is formed with one color filter material and second color filter layer 508 with a different color filter material. For example, in one embodiment in accordance with the invention, first filter layer 506 is configured as a red color filter material that transmits light propagating at the wavelengths associated with red and blocks light propagating at the wavelengths associated with blue and green, while second filter layer 508 is formed with a blue color filter material that transmits light propagating at the wavelengths associated with blue and blocks light propagating at the wavelengths associated with green and red.

Other embodiments in accordance with the invention can form first and second filter layers with different materials or different color filter materials. By way of example only, first and second filter layers can be configured as a dielectric stack.

Figure 6:
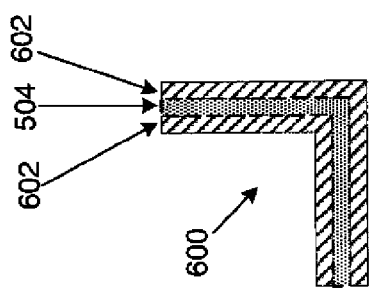
FIG. 6 is an illustration of an alternate glow blocking structure in an embodiment in accordance with the invention.

Referring now to FIG. 6, there is an illustration of an alternate glow blocking structure in an embodiment in accordance with the invention. Glow blocking structure 600 includes opaque structure 504 and filter layer 602. Filter layer 602 is formed with a single black filter material that does not transmit visible light in an embodiment in accordance with the invention.

FIG. 7 is a cross section view along line A-A' shown in FIG. 5 in an embodiment in accordance with the invention. Transistor 500 includes source/drain regions 700, 702 and gate 704. Source/drain regions 700, 702 are fabricated within substrate layer 706. In the embodiment shown in FIG. 7, substrate layer 706 includes epitaxial layer 708 and substrate 710.

Trench 712 is formed in substrate layer 706. Trench 712 is etched into substrate layer 706 at the same time as other trenches are etched in the imaging array in an embodiment in accordance with the invention. When trench 712 is etched at the same time as other trenches, an additional masking layer is not required. When substrate layer 706 includes an epitaxial layer 708 formed on substrate 710, trench 712 can be disposed in epitaxial layer 708 as shown in FIG. 7, or trench 712 can extend into a portion of substrate 710 (see FIG. 15).

An insulating layer 714 is formed over the surface of substrate layer 706. Insulating layer 714 is formed with an oxide-nitride-oxide (ONO) material in an embodiment in accordance with the invention. A borophosphosilicate glass (BPSG) layer 716 is formed over insulating layer 714. BPSG layer 716 creates a more uniform topography for the subsequent processing steps.

Passivation layer 718 is formed on BPSG layer 716, and planarization layer 720 formed on passivation layer 718. Passivation layer 718 is formed from an oxide material or oxynitride material, and planarization layer 720 from a polymethylglutarimide (PMGI) material in an embodiment in accordance with the invention. First filter layer 506 is formed on planarization layer 720, along the sidewalls of planarization layer 720 and passivation layer 718, on a portion of BPSG layer 716, and over opaque structure 504 in an embodiment in accordance with the invention. Second filter layer 508 is formed on first filter layer 506 and over opaque structure 504 in an embodiment in accordance with the invention.

When glow light 502 that is generated by transistor 500 travels along propagation path 116, first and second filter layers 506, 508 prevent the light from passing out of transistor 500. Opaque structure 504 prevents glow light 502 from propagating along path 120 and generating additional charge carriers. The light along path 116 can pass through BPSG layer 714 and passivation layer 716, but after entering first filter layer 506, only light of one color (e.g., red) will reach the boundary between first filter layer 506 and second filter layer 508. The remaining light is then absorbed by second filter layer 508. Thus, the light will not propagate out of transistor 500 and bounce back into imaging array 402. And opaque structure 504 prevents glow light 502 from propagating along path 120 and generating additional charge carriers.

Light propagation path 722 typically has little impact for two reasons. The light that propagates into substrate 710 is either absorbed by the silicon or travels through and out of substrate 710. Light does not reflect or propagate into imaging array 402 from path 722. Additionally, there is little charge diffusion into imaging array 402. The charge generated in substrate 722 by the absorbed light will recombine quickly because of its short diffusion length in that region.

This is particularly true for devices built in a well or a tub having an opposite conductivity type compared to the substrate in which the well is formed.

Figure 8:
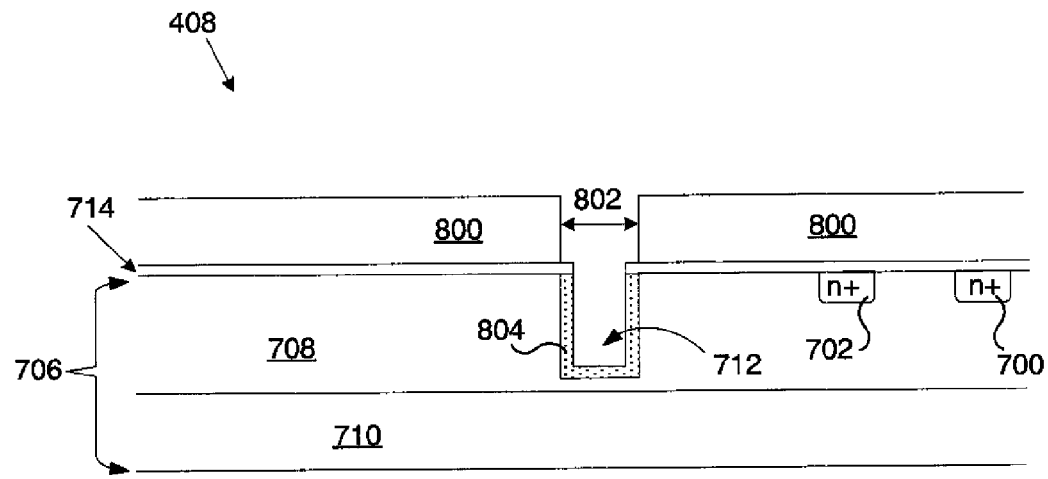
FIGS. 8-14 are cross section views depicting a method of fabricating glow blocking structure 408 shown in FIG. 4 in an embodiment in accordance with the invention.

Referring now to FIGS. 8-14, there are shown cross section views depicting a method of fabricating glow blocking structure 408 shown in FIG. 4 in an embodiment in accordance with the invention. FIG. 8 shows a portion of glow blocking structure 408 and transistor 500 after a number of initial fabrication steps have been completed. Glow blocking structure 408 and transistor 500 (see FIG. 5) at this stage includes source/drain regions 700, 702 formed in epitaxial layer 708 of substrate layer 706, insulating layer 714 formed over epitaxial layer 708, and mask layer 800 formed over insulating layer 714. Mask layer 800 has been patterned to create opening 802 where trench 712 is to be formed, and trench 712 has been etched into epitaxial layer 708. And finally, liner layer 804, typically an oxide layer, has been formed along the bottom and sidewalls of trench 712.

Figure 9:
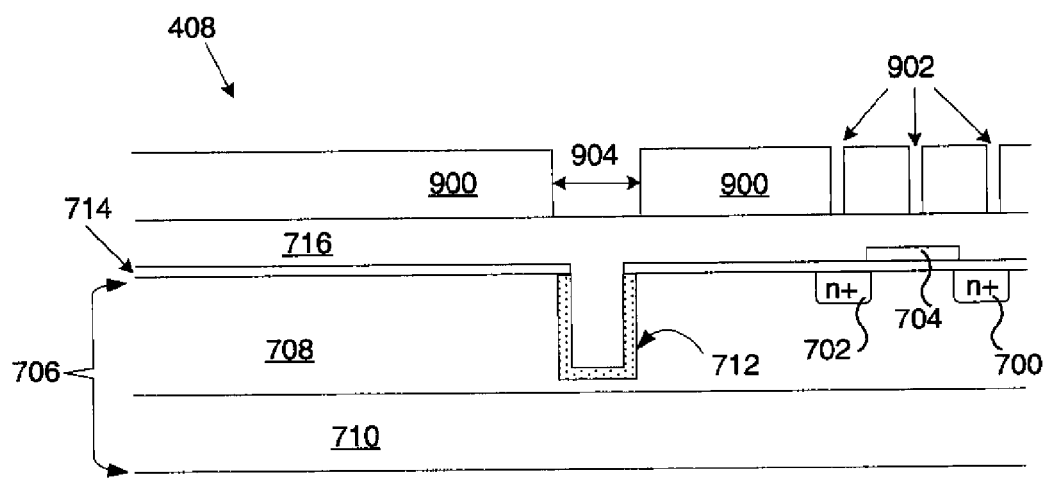

Next, as shown in FIG. 9, gate 704 is formed on insulating layer 714 and BPSG layer 716 formed over glow blocking structure 408 and transistor 500. Contact mask 900 is then formed over BPSG layer 716. Contact mask 900 is patterned to create openings 902 where contacts to source/drain regions 700, 702 and gate 704 will be formed. Contact mask 900 is implemented as a photoresist mask in an embodiment in accordance with the invention.

Contact mask 900 is also patterned to create opening 904 over trench 712. Opening 904 will be used when forming opaque structure 504. In one embodiment in accordance with the invention, contact mask 900 is simultaneously formed over imaging array 402 (see FIG. 4) with openings formed where contacts to various electrical components or circuits in some or all of the pixels 400 will be fabricated. Thus, a single contact mask is used to form contacts in imaging array 402, contacts to transistor 500, and opaque structure 504 in glow blocking structure 408.

Figure 10:
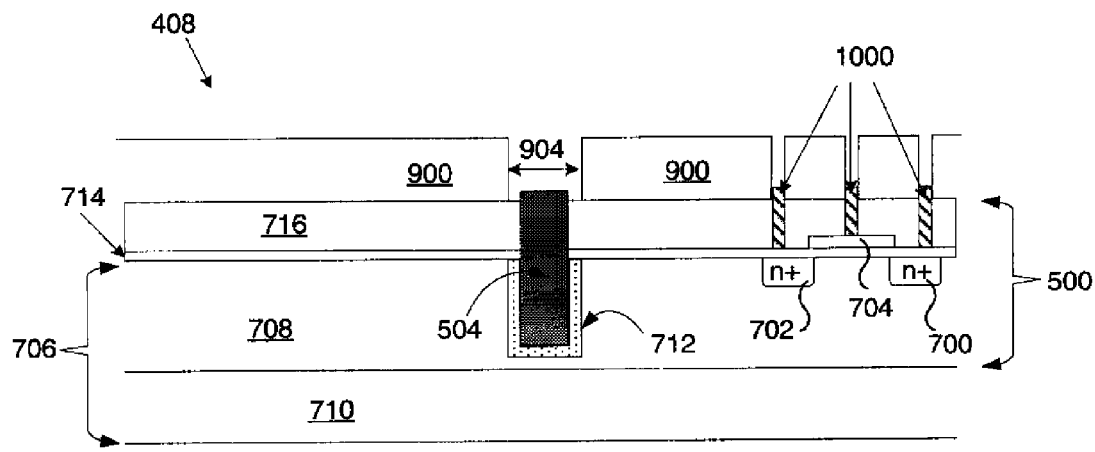

The portions of BPSG layer 716 exposed in openings 902 and 904 are removed and contacts 1000 to gate 704 and source/drain regions 700, 702 are formed (FIG. 10). Opaque structure 504 is then formed in trench 712. Contacts 1000 are formed by depositing a metal into openings 902, and opaque structure 504 by depositing the same metal or a different metal into opening 904 in an embodiment in accordance with the invention. When opaque structure 504 is made from the same metal as contacts 1000, opaque structure 504 and contacts 1000 can be formed simultaneously.

Figure 11:
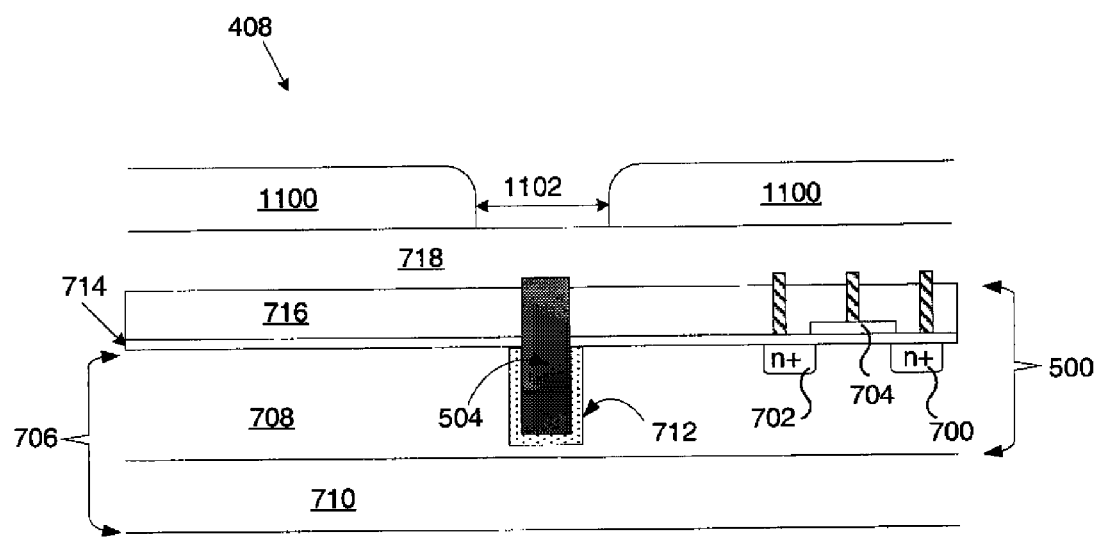

Contact mask 900 is then removed and passivation layer 718 formed over BPSG layer 716 and opaque structure 504 (FIG. 11). Mask 1100 is formed over passivation layer 718 and patterned to create opening 1102. In one embodiment in accordance with the invention, mask 1100 is simultaneously formed over some or all of image sensor 306, such as imaging array 402 (see FIG. 4), with openings created over portions of image sensor 306 in addition to opening 1102. Thus, a single mask is used to fabricate portions of image sensor 306 and glow blocking structure 408.

Figure 12:
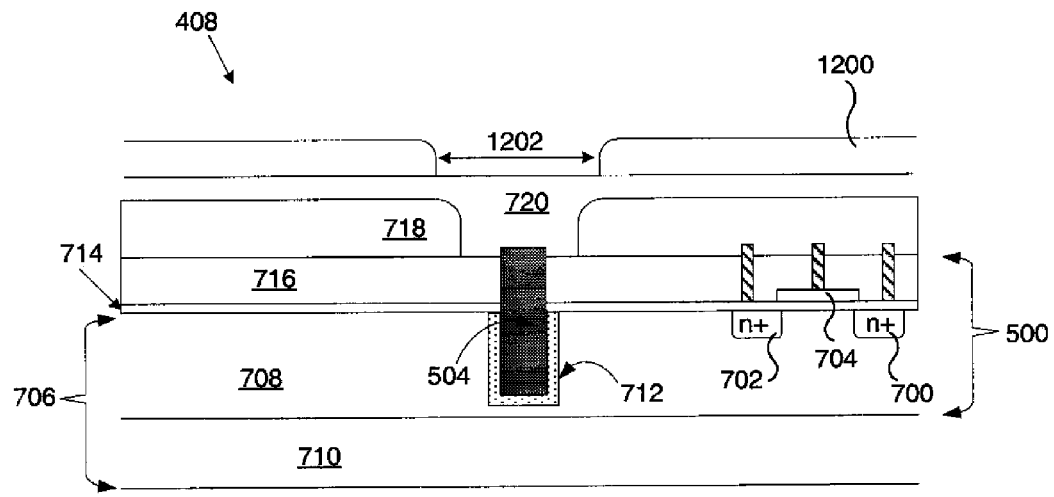

The portion of passivation layer 718 exposed in opening 1102 is removed to expose opaque structure 504 and portions of BPSG layer 716 immediately adjacent opaque structure 504. Mask 1100 is then removed and planarization layer 720 formed over passivation layer 718, opaque structure 504, and the portions of BPSG layer 716 immediately adjacent opaque structure 504 (FIG. 12). Another mask 1200 is formed over planarization layer 720 and patterned to create opening 1202. In one embodiment in accordance with the invention, mask 1200 is concurrently formed over some or all of image sensor 306, such as imaging array 402 (see FIG. 4), with openings created over portions of image sensor 306 in addition to opening 1202. Thus, a single mask is used to fabricate portions of image sensor 306 and glow blocking structure 408.

Figure 13:
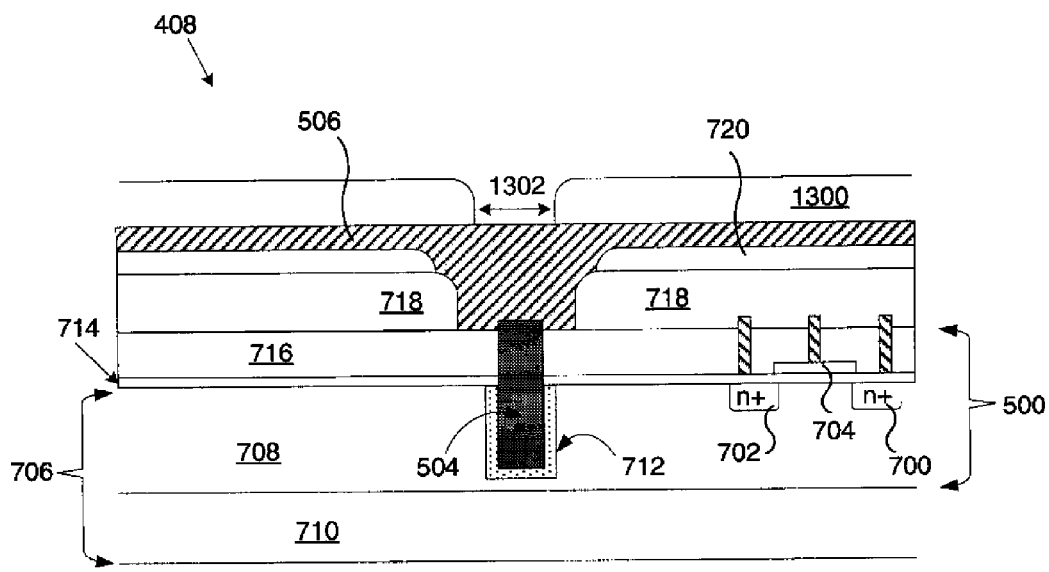

The portion of planarization layer 720 exposed in opening 1202 is removed to expose opaque structure 504 and portions of BPSG layer 716 immediately adjacent to opaque structure 504, and immediately adjacent to portions of passivation layer 718. Mask 1200 is then removed and first filter layer 506 formed over planarization layer 720, opaque structure 504, and the portions of BPSG layer 716 immediately adjacent opaque structure 504. Color filter mask 1300 is formed and patterned to create opening 1302 (FIG. 13). In one embodiment in accordance with the invention, color filter mask 1300 is simultaneously formed over imaging array 402 (see FIG. 4) during fabrication of the color filter array (CFA). Thus, a single color filter mask is used to fabricate one color filter in the CFA along with glow blocking structure 408.

Figure 14:
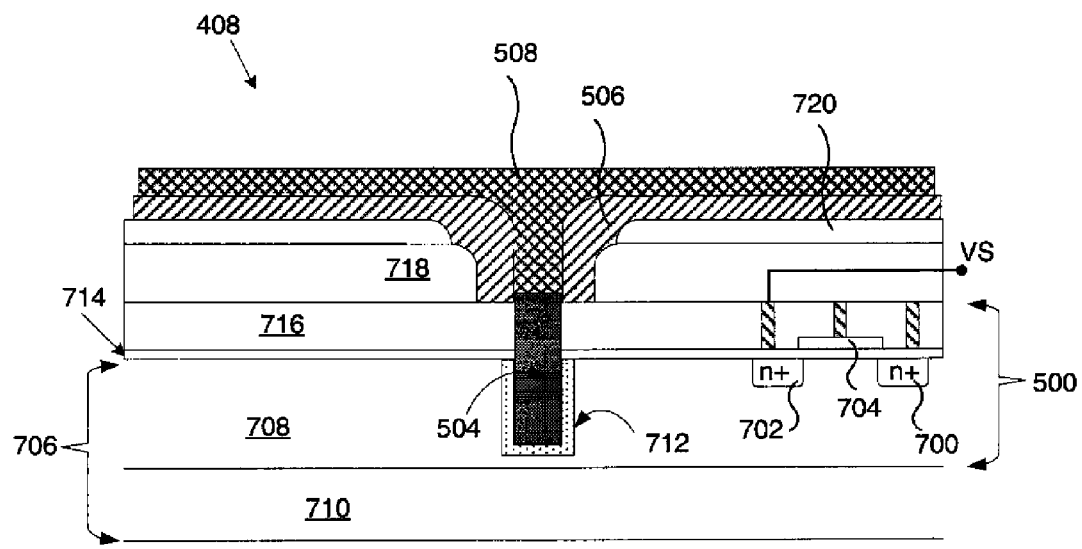

The portion of first filter layer 506 exposed in opening 1302 is then removed to expose opaque structure 504. Mask 1300 is removed and second filter layer 508 formed over first filter layer 506 (FIG. 14). In one embodiment in accordance with the invention, second filter layer is simultaneously formed over imaging array 402 (see FIG. 4) during fabrication of the color filter array (CFA).

Figure 15:
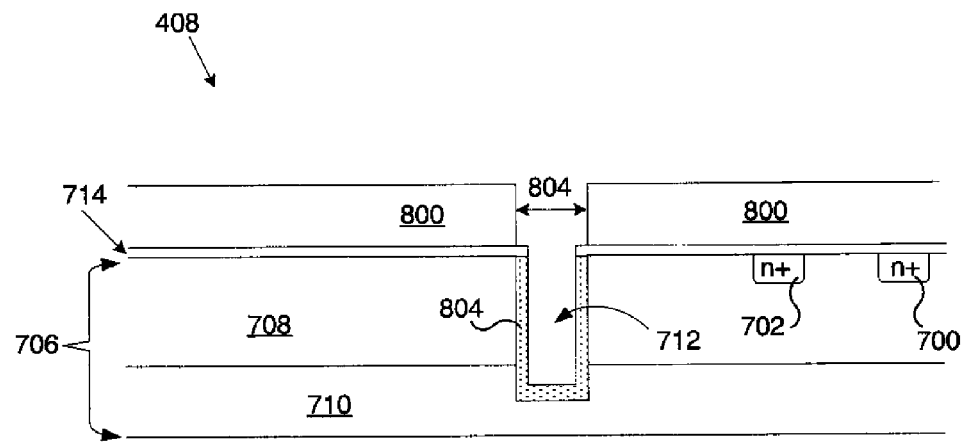
FIG. 15 is a cross section view illustrating an alternate fabrication step that can be used instead of the step shown in FIG. 8 when fabricating a glow blocking structure in an embodiment in accordance with the invention.

Referring now to FIG. 15, there is shown a cross section view illustrating an alternate fabrication step that can be used instead of the step shown in FIG. 8 when fabricating a glow blocking structure in an embodiment in accordance with the invention. Trench 712 is formed through epitaxial layer 708 and into a portion of substrate 710. This allows opaque structure 504 to extend into a portion of substrate 710 and completely block light or charge carriers from propagating or diffusing within epitaxial layer 708.

The invention has been described with reference to particular embodiments in accordance with the invention. However, it will be appreciated that variations and modifications can be effected by a person of ordinary skill in the art without departing from the scope of the invention. By way of example only, the present invention can be used in image sensors other than CCD image sensors. The present invention can be used in any type of image sensor that experiences glow from a transistor or amplifier.

PARTS LIST 100 transistor
102 semiconductor layer
104 source/drain region
106 source/drain region
108 contact
110 contact
112 gate
114 light generation region/gate-source/drain side
116 light propagation path out of transistor
118 surface
120 light propagation path within the semiconductor layer
122 charge carriers
200 imaging array
202 vertical shift register
204 horizontal shift register
206 vertical transfer direction/arrow
208 output amplifier
210 horizontal transfer direction/arrow
212 region of imaging area with amplifier glow artifact
214 image sensor
300 image capture device
302 light 304 imaging stage
306 image sensor
308 processor
310 memory
312 display
314 other input/output (I/O) elements
400 pixel
402 imaging array
404 horizontal shift register
406 output amplifier
408 glow blocking structure
410 dashed line
500 transistor
502 glow light
504 opaque structure
506 first filter layer
508 second filter layer
600 glow blocking structure
602 filter layer
700 source/drain region
702 source/drain region
704 gate
706 substrate layer
708 epitaxial layer
710 substrate
712 trench
714 insulating layer
716 borophosphosilicate glass (BPSG) layer
718 passivation layer
720 planarization layer
722 light propagation path into substrate
800 mask
802 opening
804 liner layer
900 contact mask
902 openings
904 opening
1000 contacts
1100 mask
1102 opening
1200 mask
1202 opening
1300 mask
1302 opening

The invention claimed is:

1. An image sensor comprising:
a substrate layer;
a transistor having a source/drain region formed in the substrate layer, wherein the source/drain region is connected to a voltage source;
a trench formed in the substrate layer adjacent to the source/drain region that is connected to the voltage source, wherein the trench is filled with an opaque material;
one or more layers disposed over the substrate layer;
an opening formed through the one or more layers to expose a surface of the opaque material in the trench; and
one or more layers of material that transmits light propagating at a given range of wavelengths disposed over the transistor and the one or more layers disposed over the substrate layer, wherein the one or more layers of material fills the opening and at least one of the one or more layers of material covers the exposed surface of the opaque material, wherein the one or more layers of material comprises two or more different color filters, and
wherein the opaque material in the trench and the one or more layers of material that transmits light propagating at the given range of wavelengths form a glow blocking structure that is disposed between an imaging area of the image sensor and the source/drain region of the transistor.

2. The image sensor of claim 1, wherein the opaque material comprises a metal.

3. The image sensor of claim 1, wherein the one or more layers of material comprises a dielectric stack.

4. The image sensor as in claim 1, wherein the one or more layers disposed over the substrate layer comprises:
a passivation layer disposed over the substrate layer; and
a planarization layer disposed over the passivation layer.

5. The image sensor as in claim 4, further comprising a borophosphosilicate glass (BPSG) layer disposed between the passivation layer and the surface of the substrate layer, wherein the trench extends through the BPSG layer and into the substrate layer.

* * * * *